United States Patent
Bluck et al.

(10) Patent No.: US 6,203,862 B1
(45) Date of Patent: Mar. 20, 2001

(54) PROCESSING SYSTEMS WITH DUAL ION SOURCES

(75) Inventors: Terry Bluck; James H. Rogers, both of Santa Clara, CA (US); Sean P. McGinnis, Roanoke, VA (US)

(73) Assignee: Intevac, Inc., Santa Clara, CA (US)

( * ) Notice: Subject to any disclaimer, the term of this patent is extended or adjusted under 35 U.S.C. 154(b) by 0 days.

(21) Appl. No.: 09/076,971

(22) Filed: Aug. 7, 1998

(51) Int. Cl.$^7$ ........................................... H05H 1/00
(52) U.S. Cl. .................. 427/569; 427/570; 118/723 MP; 118/723 E; 118/723 ER; 118/723 HC
(58) Field of Search ...................... 118/723 MP, 723 ER, 118/723 E, 723 HC; 156/345; 427/569, 580, 570

(56) References Cited

U.S. PATENT DOCUMENTS

| | | | |
|---|---|---|---|
| 4,183,797 | 1/1980 | Kennedy et al. | 204/192 R |
| 4,500,407 | 2/1985 | Boys et al. | 204/298 |
| 5,292,370 | 3/1994 | Tsai et al. . | |
| 5,487,785 | 1/1996 | Horiike et al. . | |
| 5,558,751 | 9/1996 | Mahler et al. | 204/298 |

OTHER PUBLICATIONS

Y. H. Lee. P. D. Richard. K. J. Bachmann & J. T. Glass. "Bias–controlled chemical vapor deposition of diamond thin films"; Appl. Phys. Lett. 56 (7), Feb. 12, 1990, 620–22.

H. Li, M.Mecray, W. Yarbourgh, & X. H. Wang, "The Growth of Diamond Films using a DC–biased hot filament"; New Diamond Science & Technology, 2nd International Conf.

Washington, D.C. Sep. 23–27, 1990, p.461–466.

N. Fujimori et al. Deposition of Diamond by Hot Filament and DC–Plasma Co–enhancement CVD; Diamond & Diamond like Films Electrochemical Soc. Proc. vol. PV 89–12. p465–474.

M.Weller et al., "Preparation and properties of highly tetrahedral hydrogenated amouphous carbon"; Physical Review B vol. 53 No. 3.

*Primary Examiner*—Thi Dang
(74) *Attorney, Agent, or Firm*—Stanley Z. Cole

(57) ABSTRACT

A substrate processing system includes a processing chamber, a substrate holder positioned in the chamber, a gas source for supplying a process gas to the chamber, first and second ion sources located in the chamber, and a power source for energizing the first and second ion sources. Each ion source ionizes the process gas to produce ions for processing a substrate disposed on the substrate holder. The first and second ion sources include first and second anodes, respectively. The power source energizes the first and second anodes in a time multiplexed manner, such that only one of the first and second ion sources is energized at any time and interactions between ion sources are eliminated.

31 Claims, 4 Drawing Sheets

PROCESSING SYSTEMS WITH DUAL ION SOURCES

FIELD OF THE INVENTION

This invention relates to systems and methods for processing a substrate using plasmas created through generated ions and, more particularly, to processing systems and methods which utilize two or more ion sources.

BACKGROUND OF THE INVENTION

Commercial plasma sources are used for both deposition onto and etching from surfaces for a wide variety of industrial applications, especially semiconductor, optical, and magnetic thin film processing. The plasma formed by such sources generates reactive neutral and ionic species which can chemically and/or physically interact with surfaces to deposit or remove material.

In many processes, the use of energetic ions from the plasma source can result in the deposition of materials with unique properties or allow the etching of surfaces under conditions which would not otherwise be effective. An ion source mounted in a vacuum chamber in which the substrate is positioned is a common method for processing substrates in a plasma. A gas with specific chemical properties is supplied to the ion source for ionization. The plasma generated is a mixture of various reactive neutral and ionic chemical species as well as energetic electrons. The energy of the ionic species interacting with the surface depends upon plasma electrical properties and pressure. Typically, the energy of ions bombarding the substrate is controlled by means of a substrate bias. Alternatively, if the substrate is electrically floating, the ion energy will be determined by the electron energy distribution which determines the difference between the plasma potential and the potential at the surface for which there is zero net current (floating potential). Control of the ion energy is desirable since deposition or etching process characteristics and resulting materials properties often depend strongly on this parameter.

In some applications, it is desirable to process both sides of a substrate simultaneously. This is typical in the deposition of thin layers of various materials in the manufacture of magnetic hard disks used in magnetic memory systems. In this case, ion sources are positioned on opposite sides of the disk. However, ion sources which utilize an anode for establishing a plasma potential tend to exhibit plasma instability and oscillation when two such sources are operated simultaneously in a processing chamber. Such unstable behavior does not permit predictable ion generation and process stability. Also, it has proven difficult to coat thin films with properties which will satisfy the requirements of a protective film on a hard disk. Thinner coatings permit the head to fly closer to the magnetics of the disk as to permit an increase in areal density. In this application, depositing overcoatings, the coating should have sufficient hardness, density, and adhesion as well as practical qualities including high deposition rates and low numbers of macroscopic particles on the surface. Accordingly, there is a need for improved substrate processing systems and methods wherein two or more ion sources may operate in a stable manner in a processing chamber and wherein the properties of the deposited layers may be improved for their intended purpose.

SUMMARY OF THE INVENTION

According to a first aspect of the invention, a substrate processing system is provided. The substrate processing system comprises a processing chamber, a substrate holder positioned in the processing chamber, a gas source for supplying a process gas to the processing chamber, first and second ion sources located in the processing chamber and a power source for energizing the first and second ion sources. Each of these ion sources ionizes the process gas to produce ions for processing a substrate disposed on the substrate holder. The first and second ion sources include first and second anodes, respectively. The power source energizes the first and second anodes in a time multiplexed manner such that only one of the first and second ion sources is energized at any time.

The power source preferably comprises means for applying a pulsed, periodic voltage to each of the first and the second anode at a frequency less than about 100 kHz. In a preferred embodiment, the frequency is in a range of about 1 to 5 kHz. The pulsed, periodic voltage applied to each of the first anode and the second anode preferably has a duty cycle less than or equal to 50%.

The first and second ion sources are generally positioned on opposite sides of the substrate in the processing system. In some systems however, ion sources may also be positioned on the same side of the substrate and may be employed for example, to feed different gases through as to achieve multilayer depositions. Ions of the process gas from the first and second ion sources may be deposited on the substrate or may be used to etch the substrate.

According to another aspect of the invention, a method for processing a substrate is provided. The method comprises the steps of positioning a substrate in a processing chamber, supplying a process gas to the processing chamber and ionizing the process gas with first and second ion sources located in the chamber to produce ions of the process gas for processing the substrate. The first and second ion sources include first and second anodes, respectively. The method further comprises the step of energizing the first anode and the second anode such that only one of the first and second ion sources is energized at any time.

According to a further aspect of the invention, a method for operating two or more ion sources in a process chamber is provided. Each of the two or more ion sources has an anode. The method comprises the step of energizing the anodes of the ion sources in a time multiplexed manner such that only one of the ion sources is energized at any time.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
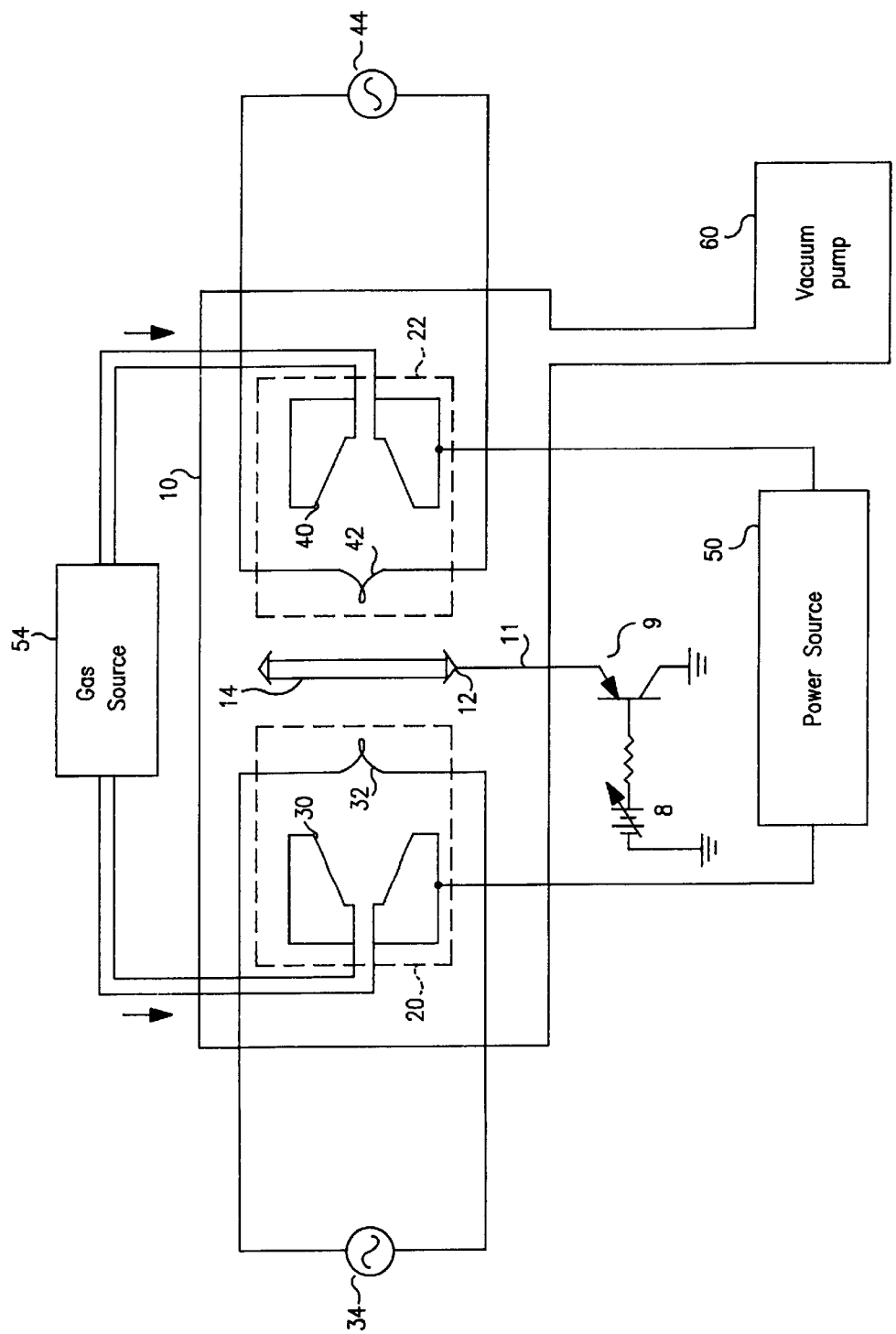
FIG. 1 is a block diagram of a processing system in accordance with the invention.

A diagram partially in block form of an example of a substrate processing system in accordance with the invention is shown in FIG. 1. The system includes an enclosed processing chamber 10, a substrate holder 12 having an electrical connection 11 to a bias voltage 8 through switch 9. Substrate holder 12 supports substrate 14 within processing chamber 10. Ion sources 20 and 22 are positioned on opposite sides of substrate 14. Processing chamber 10 is preferably conductive and is connected to ground. An electrical bias may be applied to the substrate 14 during processing, if desired. It is also possible to permit the substrate to float electrically or to connect the substrate holder to ground. Substrate 14 may, for example, be a substrate for fabrication of a magnetic hard disk and may comprise an aluminum disk of material. It is also possible to use other disk base materials such as glass, plastics or other lighter base materials to manufacturer hard disks for use in small compact computers such as laptop units. If it is desired to apply a bias to the disk through the substrate holder, it is preferred to use an electrically conductive disk base.

Ion source 20 includes an anode 30 and an electron source. The electron source may comprise a filament 32 positioned near anode 30 and a filament power supply 34 connected to filament 32. Ion source 22 includes an anode 40 and an electron source which comprises a filament 42 positioned near anode 40 and a filament power supply 44 connected to filament 42. Filament power supplies 34 and 44 electrically heat the respective filaments 32 and 42 for generation of electrons within the respective ion sources 20 and 22. Filaments 32 and 42 function as cathodes of the respective ion sources. Other electron sources, such as cold cathode electron sources, may be utilized within the scope of the invention. Anodes 30 and 40 are connected to a power source 50 for energizing the respective ion sources 20 and 22 as described below.

A gas source 54 supplies a process gas to processing chamber 10. In particular, gas source 54 may supply gas to each of the ion sources 20 and 22 in the regions between anodes 30 and 40 and the substrate 14. Examples of suitable process gases include, but are not limited to, ethylene, methane and acteylene for the deposition of diamond-like carbon, mixtures of silane and ammonia for the deposition of silicon nitride, and argon, oxygen, or hydrogen for etching.

Gas is evacuated from chamber 10 by a vacuum pump 60 connected to the chamber. The gas source 54 and the vacuum pump 60 permit controlling the gas flow rate and the pressure in chamber 10, as is known to those skilled in the art. It is preferred that the system be operated at a chamber pressure of between about 1 and about 5 mtorr, but it is also possible to employ pressures in the range of 0.1 to 20 mtorr.

In operation, each of the ion sources 20 and 22 ionizes the process gas to form ions of the process gas. The ions are directed toward substrate 14 for deposition or etching. When the ion sources 20 and 22 are energized, a plasma is formed in processing chamber 10 in the vicinity of the anodes 30 and 40. The filaments 32 and 42 supply electrons for ionization of process gas molecules within the plasma. The ions are then accelerated across a plasma sheath at the substrate surface toward substrate 14. The processing system of FIG. 1 permits both sides of substrate 14 to be processed simultaneously.

It is also possible to carry out this process by generating plasmas using other equipment and techniques. For example, an appropriate gas may be passed through an area where electromagnetic energy is used to accelerate electrons to create a plasma which can then be fed to and biased by the anodes of the system.

As indicated above, instability and oscillation are observed when ion sources 20 and 22 are both energized. The reason for such instability and oscillation is believed to be that the plasma within chamber 10 is a low impedance path for electrons generated by filaments 32 and 42. Therefore, when both ion sources are energized, the first plasma to be established creates a path of low resistance for all electrons and conducts electrons away from the other plasma source. Even if both plasma sources are able to operate, the plasma impedances do not match, thereby creating unbalanced electron sharing and oscillations. During normal operation of sources using hot filament electron sources, when a given anode is biased, all emitted electron current from the electron sources is collected by the one biased anode.

Figure 2:
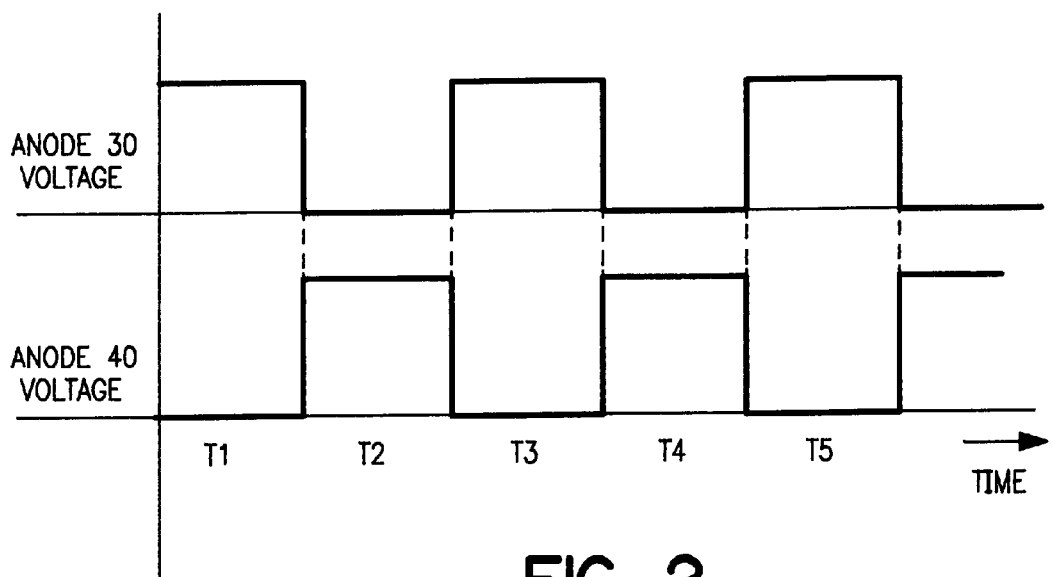
FIG. 2 is a graph of anode voltages as a function of time in accordance with a first embodiment of the invention.

According to one aspect of the invention, ion sources 20 and 22 are energized in a synchronized, time multiplexed manner such that only one of the ion sources is energized at any time. In particular, time multiplexed voltages may be applied to anodes 30 and 40 of the respective ion sources 20 and 22. An example of suitable energizing voltages is shown in FIG. 2, wherein anode 30 and anode 40 voltages are plotted as a function of time. As shown, an energizing voltage is applied to anode 30 at times T1, T3 and T5, and an energizing voltage is applied to anode 40 at times T2 and T4. The voltages applied to anodes 30 and 40 are non-overlapping in time, so that only one of the ion sources is energized at any time. The sources alternate on and off times, thus eliminating the interactions of the plasma electrons and ions between sources. The electrons are collected by one anode and then the other alternately. Synchronized, or time multiplexed, operation eliminates the need for complex shielding or grids to electrically isolate one plasma from the other.

The alternating voltages applied to anodes 30 and 40 preferably have frequencies less than about 100 kHz. In general, the frequencies of the anode voltages should be low in comparison with the reaction times of the ions in ion sources 20 and 22. This ensures that each ion source switches on and off rapidly in comparison with the on and off times of the anode voltages. In a preferred embodiment, the anode voltages have frequencies in a range of about 1 to 5 kHz.

Figure 3:
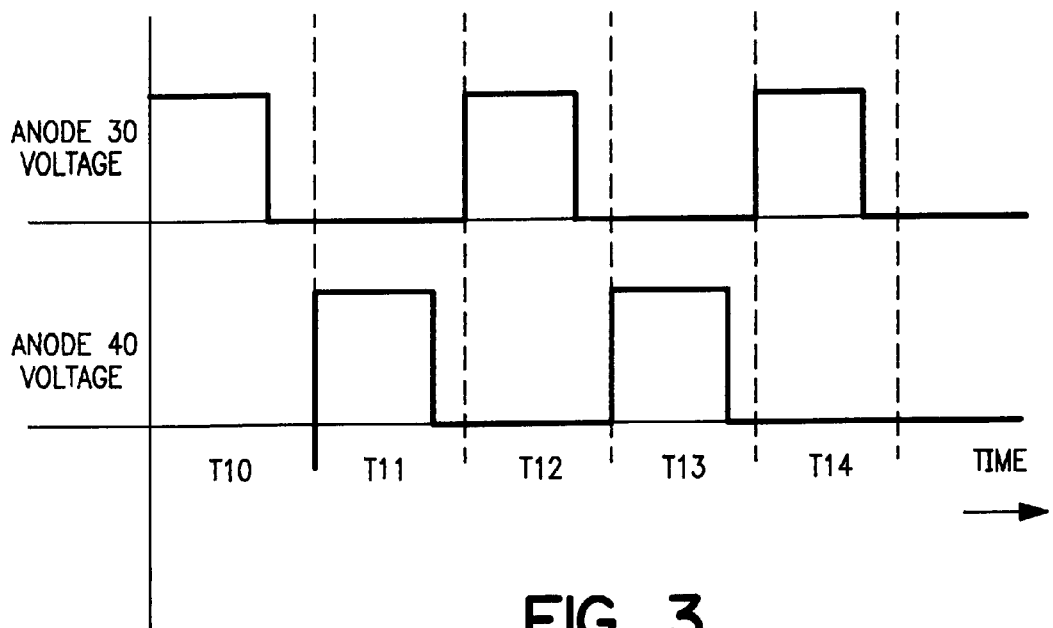
FIG. 3 is a graph of anode voltages as a function of time in accordance with a second embodiment of the invention.

For a processing chamber having two ion sources, the duty cycles of the anode voltages are preferably 50% or less and are preferably equal. Unequal duty cycles may be utilized but would result in unbalanced processing of the two sides of substrate 14. Duty cycles less than 50% may be utilized, as shown in FIG. 3, wherein voltages applied to anodes 30 and 40 are plotted as a function of time. An energizing voltage is applied to anode 30 during times T10, T12 and T14, and an energizing voltage is applied to anode 40 during times T11 and T13. The anode voltages are non-overlapping in time. The anode voltages each have duty cycles of about 40%, such that both ion sources 20 and 22 are off during a portion of each cycle of the anode voltages.

Figure 4:
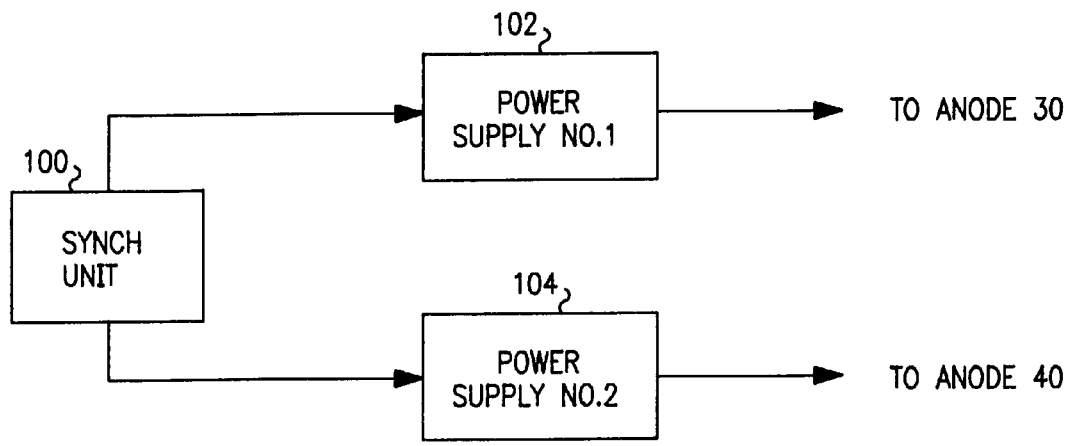
FIG. 4 is a block diagram of an example of the power source of FIG. 1.

An example of a suitable power source 50 (FIG. 1) for producing time multiplexed anode voltages is shown in FIG. 4. A synchronizing unit 100, such as a controllable pulse generator, has synchronizing outputs connected to a first power supply 102 and to a second power supply 104. Power supply 102 supplies a voltage to anode 30, and power supply 104 supplies a voltage to anode 40. The outputs of power supplies 102 and 104 may correspond to the voltage waveforms shown in FIG. 2 or FIG. 3. It will be understood that some power sources, which may be used, have a self-contained capability to output time multiplexed voltages of the type shown in FIG. 2 and/or FIG. 3.

Figure 5:
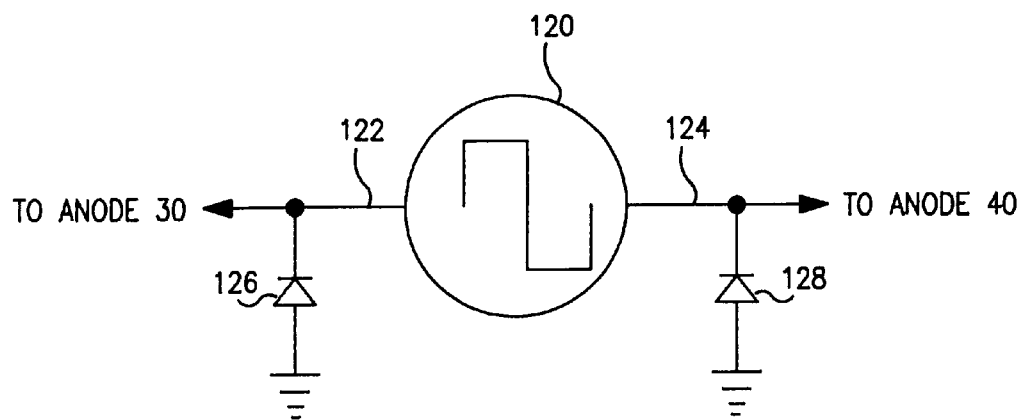
FIG. 5 is a schematic diagram of another example of the power source of FIG. 1.

Another example of a suitable power source 50 is shown in FIG. 5. A power supply 120 outputs on lines 122 and 124 bipolar squarewave voltages that are one-half cycle out of phase. The squarewave voltages on lines 122 and 124 are applied to anodes 30 and 40, respectively. A diode 126 is connected between line 122 and ground, and a diode 128 is connected between line 124 and ground. Diodes 126 and 128 clamp the negative half cycles of the squarewave voltages, so that positive voltages are applied to anodes 30 and 40.

The substrate may be biased as illustrated in FIG. 1 by DC voltage supply 8 which for illustrative purposes is shown as adjustable, as to cause the substrate to collect ion current, or a self modulated bias can be applied. In such a case transistor 7 turns on when substrate 14 attempts to go above the D.C. power supply voltage set at supply 8. In the case of an insulating substrate (or if the substrate is not connected to a voltage source), ions will be accelerated to an energy determined by the difference between the plasma potential and the floating potential at the substrate. The floating potential is defined as the potential at which electron current will equal ion current, i.e., net current=0. The difference between the plasma potential and the floating potential, and therefore the energy of the ions, can be adjusted by adjusting the source of energetic electrons relative to the plasma density. In general, lower gas pressures with greater power going to the electrons (via emission current from a cathode or RF heating) will result in greater ion energies.

Controlling voltage in a relative sense allows control of the film physical properties for deposited films. For example, the hardness, stress, and composition of diamond like films deposited from ethylene have a strong dependence on ion energy (voltage).

It will be understood that a variety of different configurations of power sources such as is illustrated as 8 or as 50 may be utilized within the scope of the present invention. Numerous power supply configurations are known to those skilled in the art. In general, the power source 50 is configured such that only one of the ion sources 20 or 22 is energized at any one time.

Figure 6:
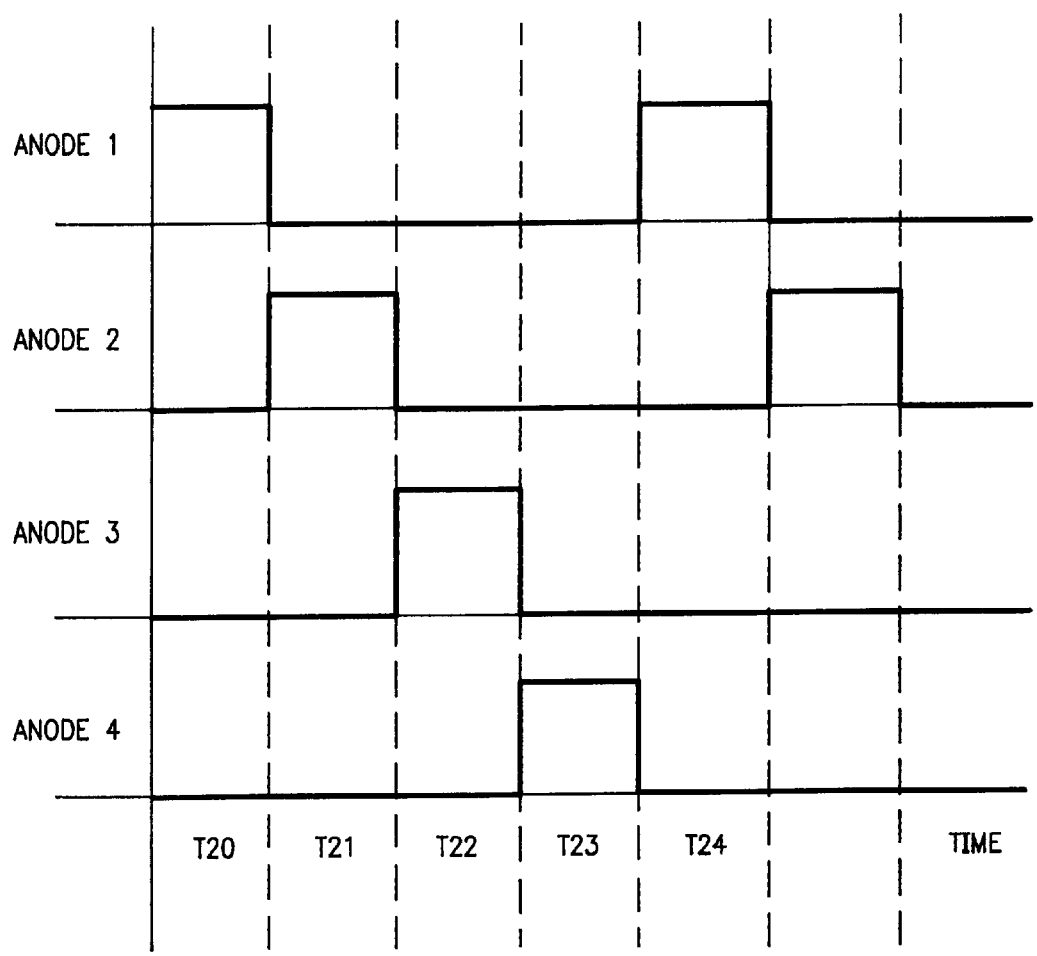
FIG. 6 is a graph of anode voltages as a function of time for a processing system having four ion sources.

A processing system having two ion sources has been discussed thus far. The time multiplexed operation of ion sources as described above may be applied to processing systems having two or more ion sources. In each case, the ion sources are energized such that only one ion source is on at any time. For example, a processing system having four ion sources may be energized with non-overlapping anode voltages having duty cycles of 25% or less. Suitable anode voltages for energizing four ion sources are illustrated in FIG. 6. Anode 1 is energized during time T20; anode 2 is energized during time T21; anode 3 is energized during time T22; anode 4 is energized during time T23; and anode 1 is again energized during time T24. The anode voltages applied to two or more ion sources depend on the number of ion sources, the desired duty cycle, the desired operating frequency and the type of structure or surfaces being treated. In each case, interaction between ion sources is eliminated.

The voltage applied to the anodes can be varied from a low value determined by the minimum necessary to get significant ionization of the working gas (~80 V), and a maximum determined by the onset of arcing on the grounded walls (typically >200 V). The number of particles on the surface of the substrate tends to increase with anode voltage, so the optimum anode voltage is generally the lowest voltage at which the required deposition rate, film properties, and reliable discharge onset can be obtained.

Biasing the substrate provides control of the energy with which the ions strike the substrate surface. For example, if the anode voltage is $V_a$=100 V, and the substrate voltage is $V_s$ =50 V, the ions will be accelerated to an energy of $V_a-V_s$=50 eV. Controlling this relative voltage allows control of the hardness and stress of the deposited film. This has particularly been found to be the case when depositing thin films of diamond-like carbon (DLC) simultaneously on both sides of the substrate. Further, we have found that for $V_a-V_s$>120 V produces very hard (>25 Gpa) films with high stress (approx 4 Gpa); whereas, for $V_a-V_s$ of approximately 40 V, the films are much less hard (approx 9 Gpa) with low stress (<0.5 Gpa).

Although the mechanisms of the instant invention are not fully understood, it is presently believed that a plasma is formed, biased positively in reference to the grounded walls, and ions are accelerated across a sheath at the interface between the plasma and the biased substrate, in the event that the substrate is biased. Using a plasma rather than, for example, an ion beam, allows much higher deposition rates than otherwise possible. In this connection we have achieved deposition of protective overcoating layers in accordance with this invention at rates equal to or in excess of 12 angstroms per second.

An advantage of the biased plasma approach over a grided ion beam source, a source that can be turned on and off, is that it is generally difficult to obtain high deposition rates at low ion energies because of space charge limits in acceleration grids. Also, the nature of the plasma sheath ensures that the ion acceleration is normal to the surface of the substrate over the entire surface area, whereas ion beams will have some divergence from normal incidence away from the axis of the substrate.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A substrate processing system comprising:
    a processing chamber;
    a substrate holder positioned in said processing chamber;
    a gas source coupled to said processing chamber for supplying a process gas to said processing chamber;
    a first ion source in said chamber for ionizing said process gas to produce ions for processing a substrate disposed on said substrate holder, said first ion source comprising a first anode and a first electron source;
    a second ion source in said chamber for ionizing said process gas to produce ions for processing the substrate, said second ion source comprising a second anode and a second electron source; and
    a power source for energizing said first anode and said second anode in a time multiplexed manner such that only one of said first and second ion sources is energized at any time.

2. A substrate processing system as defined in claim 1 wherein said power source comprises means for applying a pulsed, periodic voltage to each of said first anode and said second anode at a frequency less than about 100 kHz.

3. A substrate processing system as defined in claim 1 wherein said power source comprises means for applying a pulsed, periodic voltage to each of said first anode and said second anode at a frequency in a range of about 1 to about 5 kHz.

4. A substrate processing system as defined in claim 1 wherein said power source comprises means for applying a pulsed, periodic voltage to each of said first anode and said second anode at a frequency that is less than a reaction time of a plasma in said chamber.

5. A substrate processing system as defined in claim 1 wherein said power source comprises means for applying a pulsed, periodic voltage to each of said first anode and said second anode at a duty cycle less than or equal to 50%.

6. A substrate processing system as defined in claim 1 wherein said power source includes means for applying a pulsed, periodic voltage to each of said first anode and said second anode at a duty cycle of less than 50%, wherein said first ion source and said second ion source are both off during a portion of each cycle of the pulsed, periodic voltages.

7. A substrate processing system as defined in claim 1 wherein said power source comprises means for generating a bipolar squarewave voltage, means for applying a first half cycle of said bipolar squarewave voltage to said first anode and means for applying a second half cycle of said bipolar squarewave voltage to said second anode.

8. A substrate processing system as defined in claim 1 wherein said power source comprises first and second power supplies for energizing said first and second anodes, respectively, and means for synchronizing said first and second power supplies such that said first and second anodes are energized at different times.

9. A substrate processing system as defined in claim 1 wherein said power source comprises a power supply having a first and a second pulsed output, each said pulsed output coupled to said first and second anodes, respectively, wherein said first and second outputs comprise pulses that are phased shifted such that said first and second anodes are energized at different times.

10. A substrate processing system as defined in claim 1 wherein said first and second ion sources are positioned on opposite sides of the substrate.

11. A substrate processing system as defined in claim 1 wherein said first and second electron sources each comprise a filament for generating electrons and a filament power supply coupled to said filament for heating said filament.

12. A substrate processing system as defined in claim 1 wherein said first and second ion sources deposit ions of said process gas on the substrate.

13. A substrate processing system as defined in claim 1 wherein said first and second ion sources generate ions of said process gas for etching said substrate.

14. A substrate processing system as defined in claim 1 wherein said power source includes means for energizing said first anode and said second anode with first and second waveforms, respectively, that are out of phase.

15. A method for processing a substrate, comprising the steps of:
positioning a substrate in a processing chamber;
supplying a process gas to the processing chamber;
ionizing said process gas with a first ion source located in said chamber to produce ions of said process gas for processing the substrate, said first ion source comprising a first anode and a first electron source;
ionizing said process gas with a second ion source located in said chamber to produce ions of said process gas for processing the substrate, said second ion source comprising a second anode and a second electron source; and
energizing said first anode and said second anode such that only one of said first and second ion sources is energized at any time.

16. A method as defined in claim 15 wherein the step of energizing said first anode and said second anode comprises applying pulsed, periodic voltages to each of said first anode and said second anode at a frequency less than about 100 kHz.

17. A method as defined in claim 15 wherein the step of energizing said first anode and said second anode comprises applying pulsed, periodic voltages to each of said first anode and said second anode at a frequency in a range of about 1 to about 5 kHz.

18. A method as defined in claim 15 wherein the step of energizing said first anode and said second anode comprises energizing said first anode and said second anode with first and second periodic voltages, respectively, that are out of phase.

19. A method as defined in claim 18 wherein said first and second periodic voltages have duty cycles of less than 50% and said first and second ion sources are both off during a portion of each cycle of the pulsed, periodic voltages.

20. A method for operating two or more ion sources in a processing chamber, said two or more ion sources each having an anode, comprising the step of:
energizing the anodes of said two or more ion sources in a time multiplexed manner such that only one of said two or more ion sources is energized at any time.

21. A substrate processing system comprising:
a processing chamber;
a substrate holder positioned in said processing chamber;
a gas for supplying a process gas to said processing chamber;
first and second anodes positioned in said processing chamber;
an electron source in said chamber for producing electrons in regions of said first and second anodes for ionizing said process gas to produce ions for processing a substrate disposed on the substrate holder; and
a power source for energizing said first and second anodes in a time multiplexed manner such that only one of said anodes is energized at any time.

22. A substrate processing system in accordance with claim 21 in which said substrate holder is electrically connected to a power supply to permit biasing of a substrate in position on said substrate holder.

23. A substrate processing system in accordance with claim 1 in which said substrate holder is electrically connected to a power supply to permit biasing of a substrate in position on said substrate holder.

24. A substrate processing system in accordance with claim 1 in which said processing gas is fed to opposite sides of a substrate on said substrate holder.

25. A substrate processing system in accordance with claim 24 in which said substrate holder is connected to a bias source to permit biasing of a substrate on said substrate holder.

26. A method in accordance with claim 15 including biasing said substrate in said processing chamber during processing thereof.

27. A method in accordance with claim 26 including positioning said ion sources on different sides of said substrate.

28. A method in accordance with claim 26 including feeding process gas to each side of said substrate.

29. A method in accordance with claim 26 including applying a self modulated bias to said substrate.

30. A processing system to process the two surfaces of a thin electrically conductive substrate at a processing station comprising:

a processing chamber;

a substrate holder positioned in said processing chamber;

a source of gas coupled to said processing chamber to feed gas into said chamber on surface sides of a substrate on said substrate holder;

a power source and first and second plasma generators, each said plasma generator positioned on a surface side of a substrate on said substrate holder to generate a plasma thereat; said power source connected to said first and second plasma generators to energize said plasma generators in a time multiplexed manner such that only one of said plasma generators is energized at any one time; and, a power source connected to said substrate holder to electrically bias a substrate on said holder.

31. A substrate processing system comprising:

a processing chamber;

a substrate holder positioned in said processing chamber;

a gas source coupled to said processing chamber to supply process gases to said processing chamber;

a first plasma generator in said chamber connected to a power source for ionizing said process gas to produce ions for processing a substrate disposed on said substrate holder;

a second plasma generator in said chamber connected to a power source for ionizing said process gas to produce ions for processing a substrate disposed on said substrate holder; each of said plasma generators being disposed on opposite sides of the surfaces of a substrate on said substrate holder;

a power source for energizing in a time multiplexed manner such that only one of said generators is energized at any one time; and an electrical source connected to said substrate holder to bias a substrate disposed on said holder for processing.

* * * * *